US009832817B2

(12) United States Patent
Von Riewel et al.

(10) Patent No.: US 9,832,817 B2
(45) Date of Patent: Nov. 28, 2017

(54) DEVICE FOR IRRADIATING A SUBSTRATE

(71) Applicant: Heraeus Noblelight GmbH, Hanau (DE)

(72) Inventors: Larisa Von Riewel, Mainaschaff (DE); Sven Linow, Darmstadt (DE)

(73) Assignee: Heraeus Noblelight GmbH, Hanau (DE)

( * ) Notice: Subject to any disclaimer, the term of this patent is extended or adjusted under 35 U.S.C. 154(b) by 436 days.

(21) Appl. No.: 14/416,958

(22) PCT Filed: Jul. 17, 2013

(86) PCT No.: PCT/EP2013/065082
§ 371 (c)(1),
(2) Date: Jan. 23, 2015

(87) PCT Pub. No.: WO2014/016178
PCT Pub. Date: Jan. 30, 2014

(65) Prior Publication Data
US 2015/0181651 A1 Jun. 25, 2015

(30) Foreign Application Priority Data
Jul. 23, 2012 (DE) .................. 10 2012 106 667

(51) Int. Cl.
*F26B 3/30* (2006.01)
*H05B 3/00* (2006.01)
*H01L 21/67* (2006.01)

(52) U.S. Cl.
CPC ...... *H05B 3/0047* (2013.01); *H01L 21/67115* (2013.01)

(58) Field of Classification Search
None
See application file for complete search history.

(56) References Cited

U.S. PATENT DOCUMENTS 4,511,788 A * 4/1985 Arai ............... H05B 3/009
219/405
4,535,228 A * 8/1985 Mimura ............ C23C 14/541
118/725
(Continued)

FOREIGN PATENT DOCUMENTS

CN 2657187 Y 11/2004
DE 1815946 U 8/1960
(Continued)

OTHER PUBLICATIONS

Int'l Search Report dated Nov. 5, 2013 in Int'l Application No. PCT/EP2013/065082.
(Continued)

*Primary Examiner* — Thor Campbell
(74) *Attorney, Agent, or Firm* — Panitch Schwarze Belisario & Nadel LLP

(57) ABSTRACT

Known apparatuses for irradiating a substrate include a housing and, within the housing, a receptacle for the substrate having a circular irradiation surface and a first emitter for generating optical radiation having a first emitter tube arranged in a plane of curvature extending parallel to the irradiation surface and having an emitter tube end, whereby the receptacle and the first emitter can be moved with respect to each other. In these apparatuses, the irradiation surface includes first and second semi-circular surface portions. An improvement of the known apparatuses, which enables the substrate to have a rotationally symmetrical, homogeneous temperature distribution while keeping the complexity of design and control technology minimal, provides a first emitter tube having a curved illumination length section, extending with a mirror symmetrical-oval basic shape in the plane of curvature, wherein the first illumination length
(Continued)

section is associated essentially with one of the semicircular surface portions.

18 Claims, 4 Drawing Sheets

(56) References Cited

U.S. PATENT DOCUMENTS

| | | | | |
|---|---|---|---|---|
| 4,578,144 A * | 3/1986 | Hiramoto | ................ | C30B 13/24 |
| | | | | 117/43 |
| 4,832,249 A * | 5/1989 | Ehler | .................. | B23K 1/0053 |
| | | | | 219/411 |
| 5,128,515 A * | 7/1992 | Tanaka | ................ | C23C 16/4411 |
| | | | | 118/725 |
| 5,386,491 A * | 1/1995 | Mewissen | ........... | A47J 37/0623 |
| | | | | 219/411 |
| 5,841,108 A | 11/1998 | Lacombe | | |
| 5,889,258 A * | 3/1999 | Lubomirski | ......... | H05B 3/0047 |
| | | | | 219/390 |
| 6,081,072 A | 6/2000 | Suzuki | | |
| 6,570,134 B2 * | 5/2003 | Suzuki | .............. | H01L 21/67115 |
| | | | | 118/724 |
| 6,646,227 B2 * | 11/2003 | Yura | ................. | G03G 15/2053 |
| | | | | 219/216 |
| 6,897,409 B2 * | 5/2005 | Yura | ................. | G03G 15/2053 |
| | | | | 219/216 |
| 6,965,093 B2 * | 11/2005 | Falter | ............... | H01L 21/67115 |
| | | | | 118/50.1 |
| 7,700,899 B2 * | 4/2010 | Suzuki | ................ | H05B 3/0047 |
| | | | | 219/391 |
| 9,265,091 B2 * | 2/2016 | Ueshima | ............. | H05B 3/0033 |
| 2004/0089649 A1 | 5/2004 | Falter | | |

FOREIGN PATENT DOCUMENTS

| | | |
|---|---|---|
| DE | 8802042 U1 | 4/1988 |
| DE | 10051125 A1 | 5/2002 |
| DE | 102006047472 A1 | 4/2008 |
| EP | 0343868 A2 | 11/1989 |
| EP | 0425981 A2 | 5/1991 |
| EP | 0786922 A1 | 7/1997 |
| JP | S63-222430 A | 9/1988 |

OTHER PUBLICATIONS

Office Action dated Jan. 24, 2013 in DE Application No. 10 2012 106 667.1.

Office Action dated Jun. 2, 2016 in CN Application No. 201380038694.1.

* cited by examiner

DEVICE FOR IRRADIATING A SUBSTRATE

CROSS-REFERENCE TO RELATED APPLICATIONS

This application is a Section 371 of International Application No. PCT/EP2013/065082, filed Jul. 17, 2013, which was published in the German language on Jan. 30, 2014, under International Publication No. WO 2014/016178 A1 and the disclosure of which is incorporated herein by reference.

BACKGROUND OF THE INVENTION

The invention relates to an apparatus for irradiating a substrate, comprising a housing and, within the housing, a receptacle for the substrate to be irradiated with a circular irradiation surface comprising a first semi-circular surface portion and a second semi-circular surface portion, a first emitter for generating optical radiation, having a first emitter tube that is arranged in a plane of curvature extending parallel to the irradiation surface and has an emitter tube end through which power supply means are guided, whereby the receptacle and the first emitter can be moved with respect to each other.

The invention further relates to a use of the apparatus according to embodiments of the invention for irradiating a substrate.

The invention also relates to an emitter for generating optical radiation, comprising an emitter tube that is curved in a plane of curvature and has an emitter tube end through which power supply means are guided, whereby the emitter tube comprises multiple arcuate curved sections each having a radius of curvature.

The apparatuses and/or emitters are used, for example, for drying paints and lacquers, for curing coatings, for heating food products or for processing semiconductor wafers.

Known apparatuses for irradiation and/or thermal treatment of a substrate consist of a process chamber, in which a receptacle for the substrate to be irradiated and at least one optical emitter, for example an infrared emitter, are arranged. Usually, uniform irradiation of the substrate surface or a homogeneous temperature distribution inside the substrate is important for the process result. Uniform irradiation of the substrate surface is therefore desirable as a matter of principle if a homogeneous temperature distribution can be achieved already by this means. However, depending on the process conditions or geometry, e.g. due to evaporation of solvents, shading of radial zones, process gas flow, the homogeneous temperature distribution inside the substrate can be achieved by a radially inhomogeneous irradiation of the substrate.

An irradiation apparatus of the aforementioned type is known, for example, from German published patent application DE 100 51 125 A1. The rapid heating unit for semiconductor wafers disclosed therein comprises a rotatably mounted receptacle for a substrate having a circular irradiation surface and multiple infra-red emitters with a linear, cylindrically-elongated emitter tube made of quartz glass. In order to ensure a uniform radiation distribution, in particular in the case of a rotating substrate, the rapid heating unit has multiple optical emitters arranged parallel to one another; taken together forming a two-dimensional emitter. To further ensure a uniform irradiation on all sides of the substrate, the infrared emitters are arranged in two irradiation planes, namely above and below the irradiation surface.

Due to the two-dimensional array of the infrared emitters, a plurality of infrared emitters is provided in the irradiation apparatus with respect to the surface to be irradiated. The irradiation apparatus also has very high radiated power per unit area. To achieve a homogeneous distribution of the heating power, the heating power of the infrared emitters must therefore be coordinated. This applies especially to the edges of the irradiation surface. An irradiation apparatus with a two-dimensional array of linearly-elongated infrared emitters therefore is complex in terms of design and control technology.

Moreover, in addition to emitters having a linear, cylindrically-elongated emitter tube, the prior art also includes emitters with a circularly curved emitter tube. Accordingly, the teaching of German utility model DE 88 02 042 U1 is an infrared radiation source having an emitter tube that is multiply curved in a plane and has a circular basic shape. The omni-directional emitter is suitable, for example, for heating burners, or for heating of pipe surfaces.

An apparatus for irradiation of wafers is known from Japanese patent application publication JP 63-222430 A, in which multiple emitters having a semi-circular emitter tube are arranged in pairs parallel to an irradiation plane, such that they extend in concentric circles about a center of the irradiation surface.

The teaching of German utility model DE 18 15 946 U is a fluorescent lamp having an emitter tube comprising an illumination length section that is ovally-curved in a plane of curvature.

BRIEF SUMMARY OF THE INVENTION

The invention is therefore based on the object to provide an apparatus for irradiating a substrate that enables the substrate to have a rotationally symmetrical, homogeneous temperature distribution while keeping the complexity of design and control technology minimal.

The invention is also based on the object to provide a suitable use of the inventive apparatus.

Finally, the invention is based on the object to provide an emitter for generating optical radiation that enables essentially constant irradiation intensity or temperature distribution with respect to a semicircular irradiation surface and is also easy and inexpensive to manufacture.

Referring to the apparatus, the object is solved according to the invention based on an apparatus for irradiating a substrate of the aforementioned type in that the first emitter tube has a curved illumination length section, which extends with a mirror symmetrical-oval basic shape in the plane of curvature, wherein the first illumination length section is associated with one of the semicircular surface portions.

In the irradiation apparatus according to embodiments of the invention, a first emitter for generating optical radiation is provided within the housing next to a receptacle for the substrate to be irradiated. Since the receptacle and emitter are movable relative to each other, the emitter irradiates a circular irradiation surface. The receptacle and/or the first emitter can be rotated about a rotational axis for this purpose. Optical emitters in the scope of the invention include, for example, infrared emitters, UV emitters or emitters emitting visible light. The apparatus can comprise one or more emitters.

Homogeneous irradiation of the irradiation surface is obtained, if the irradiation intensity impinging on each unit of surface area of the irradiation surface per unit of time is as uniform as possible. Since the receptacle and the first emitter can be moved relative to each other, the rotational motion achieves a homogeneous irradiation of the points of the substrate that are situated on a common circular path as a matter of principle. However, the length of the circular, path swept-over in one unit of time increases with increasing radial distance from the rotational axis, such that the surface to be irradiated needs to be exposed to different irradiation intensities as a function of its radial distance from the rotational axis in order to achieve homogeneous radiation. The regions of the irradiation surface more distant from the rotational axis therefore need to be irradiated at higher irradiation intensities.

In order to ensure a rotationally-symmetrical, homogeneous irradiation or temperature distribution, according to embodiments of the invention, a first emitter is provided with a first emitter tube that has a curved illumination length section. In contrast to an emitter having a linearly-elongated emitter tube, the curvature of the illumination length section attains a larger effective emitter length section in a circular path that is more distant from the center of rotation, such that higher irradiation intensity can be provided to the irradiation surface that increases with radial distance.

The illumination length section shall be understood to be the region of the emitter tube within which useful radiation is generated. The illumination length section corresponds to, or is smaller than, the emitter tube length. According to embodiments of the invention, it has a mirror symmetrical-oval basic shape. A mirror symmetrical-oval basic shape shall be understood to mean a round convex shape having at least two different sections of curvature. It comprises a curved first section having a first radius of curvature and an elongated second section having a second radius of curvature, wherein the second radius of curvature is larger than the first radius of curvature. Due to the radii of curvature being different, the irradiation section length has a compressed and elongated shape. The basic shape may be closed, but preferably it is open.

The mirror symmetry of the basic shape also contributes to a uniform irradiation of the irradiation surface. Due to the mirror symmetrical-oval basic shape, homogeneous irradiation of the irradiation surface can be achieved by using the elongated region of the emitter tube for irradiating a part of the irradiation surface situated at a large radial distance from the axis of rotation, preferably a peripheral region of the irradiation surface. This enables the radiation intensity to be adapted to the radial distance. By varying the basic shape, a homogeneous temperature distribution can be assured even for cases, in which a non-uniform irradiation intensity is required. More preferably, the basic shape is suitable for increasing the irradiation intensity with increasing radial distance from the center of the irradiation surface.

According to embodiments of the invention, illumination length section is provided to be associated with one of the semi-circular part-surfaces of the irradiation surface. Having this association allows sufficient irradiation of the irradiation surface in the peripheral region and in the region of the axis of rotation to be attained, for example, by the elongated region of the illumination length being associated with an outer zone of the irradiation surface, and the remaining curved section being associated with an inner part of the irradiation surface that is close to the axis of rotation.

In an advantageous embodiment of the apparatus according to the invention, the invention provides the apparatus to comprise a second emitter for generating optical radiation having a second emitter tube that is arranged in the plane of curvature and has an emitter tube end through which power supply means are guided, wherein the second emitter tube has a curved illumination length section, which extends with a mirror symmetrical-oval basic shape in the plane of curvature, and in that the illumination length sections of the first and the second optical emitter extend point-symmetrical with respect to each other.

A second emitter for generating optical radiation having a curved illumination length section with a mirror symmetrical-oval basic shape contributes to a uniform, rotationally-symmetrical, homogeneous irradiation of the irradiation surface or substrate. Since both the first and the second emitters are arranged in the same plane of curvature, their distance to the irradiation surface is equal. Therefore, particularly homogeneous irradiation or temperature distribution is obtained if the irradiation power and irradiation distribution of the second emitter matches that of the first emitter. Therefore, the second optical emitter preferably corresponds to the first optical emitter.

Since the illumination length sections of the first and second emitter have a mirror-symmetrical shape, a central axis is defined for each emitter. The two emitters are arranged appropriately in the plane of curvature such that the illumination length sections of the first and the second optical emitter extend point-symmetrically with respect to each other. In an arrangement of this type, the central axes of both emitters extend offset or co-linear with respect to each other. Both emitters are associated essentially to a semi-circular surface portion or two semicircular surface portions.

In a further, likewise preferred embodiment of the apparatus according to the invention, the invention provides the illumination length section of the first emitter to comprise multiple arcuate curved sections each having a radius of curvature, wherein the illumination length section, as seen from the emitter tube end, comprises, in succession, a first curved section with a curvature to the left and a first radius of curvature, a second curved section with a curvature to the right and a second radius of curvature, a third curved section with a curvature to the right and a third radius of curvature, a fourth curved section with a curvature to the right and the second radius of curvature, and a fifth curved section with a curvature to the left and the first radius of curvature, wherein the third radius of curvature is larger by at least a factor of three than the first and the second radius of curvature.

The first emitter comprises multiple arcuate curved sections whose extension is defined by a central axis of the emitter tube. A curved section shall be understood to be a section of the emitter tube whose extension can be described in approximation by a circle. In this context, a respective radius of curvature is specified for each curved section. The radius of curvature in this context is the distance between the center of the circle and the central axis of the emitter. The curved sections can be right next to each other or can be situated at a distance from each other.

Moreover, each curved section comprises a direction of curvature, which can extend to the right or to the left as seen in a top view onto the plane of curvature. Seen from the emitter tube end, the illumination length section of the emitter tube comprises, in succession, meaning directly or indirectly after each other the following curved sections: a first curved section with a curvature to the left and a first radius of curvature, a second curved section with a curvature to the right and a second radius of curvature, a third curved section with a curvature to the right and a third radius of curvature, a fourth curved section with a curvature to the right and the second radius of curvature and a fifth curved section with a curvature to the left and the first radius of curvature.

Since the third radius of curvature is larger than the first and the second radii of curvature by at least a factor of three, a comparatively shallow and elongated, as compared to the other curved sections, third curved section is obtained, which is available for irradiation, for example, of the peripheral region. As a result, a comparatively large illumination length section is associated with the peripheral region. Preferably, the length of the third curved section accounts for 25% to 50% of the illumination length section. If the length of the third curved section is less than 25% of the illumination length, the longitudinal extension of the emitter is small. If the length of the third curved section accounts for more than 50%, an unnecessarily long, elongated curved section is obtained.

Furthermore, it has proven to be advantageous that the first and the second curved section as well as the fourth and the fifth curved section are kept at a distance from each other by a linear emitter tube section.

Having a linear emitter tube section allows the distance between the emitter tube ends to be adjusted. In this context, especially the length of the linear emitter tube sections affects the subsequent position of the emitter tube ends. If, in addition, the power supply is guided through both emitter tube ends, the presence of the linear sections makes it easier to maintain a certain distance between the power supplies and thus makes the electrical contacting thereof easier.

Moreover, the linear sections extend, at least in part, in radial direction as viewed from the intercept of the axis of rotation and the plane of curvature, such that the extension and the length of the linear sections can be used to also adapt the irradiation intensity per unit area with respect to the section of the irradiation surface associated with the linear sections.

An advantageous embodiment provides the first emitter tube to have an emitter tube length, and provides the illumination length section of the first emitter to account for at least 75%, preferably at least 90%, of the corresponding emitter tube length.

Since the illumination length section accounts for at least 75% of the emitter tube length, the emitter tube has a small fraction of non-illuminated areas. An emitter tube of this type ensures that the design of the emitter and thus of the irradiation apparatus is compact. This applies, in particular, when the illumination length section accounts for at least 90% of the emitter tube length.

It has proven expedient that the circular irradiation surface comprises an inner irradiation zone in the form of a circular surface and a ring-shaped outer irradiation zone surrounding the inner irradiation surface, wherein the circular inner irradiation zone and the ring-shaped outer irradiation zone have the same surface area, and wherein 40% to 70% of the length of the illumination length section of the first emitter are associated with the outer ring-shaped irradiation zone.

The irradiation surface comprises a circular inner irradiation zone and a ring-shaped outer irradiation zone of the same surface area. The center of the outer and inner irradiation zone is the axis of rotation of the irradiation apparatus.

Since the receptacle and the first emitter can be moved with respect to each other, homogeneous irradiation is achieved only if a higher irradiation power is provided with increasing radial distance from the axis of rotation. The irradiation power impinging on the outer irradiation zone depends, for example, on the length of the illumination length section (illumination length) associated with the outer ring-shaped irradiation zone. The illumination length is associated with the circular inner irradiation zone and the ring-shaped outer irradiation zone or extends beyond them. If the illumination length associated with the outer ring-shaped irradiation zone is less than 40%, the outer irradiation zone is irradiated only little. If the illumination length associated with the outer ring-shaped irradiation zone is more than 70%, the energy input into the outer irradiation zone is comparatively high.

In a preferred embodiment of the apparatus according to the invention, the illumination length section of the first emitter is arranged exclusively over one of the semicircular surface portions.

An emitter being arranged exclusively over one of the semicircular surface portions arranged generally leads only a part of the substrate to be irradiated being heated at any time. Differences in heating that may occur are dependent on the relative rotational speed in this context, though. At a high rotational speed, the effect of differential heating disappears. A illumination length section of the first emitter being arranged exclusively over the first semi-circular surface portion allows the design of the irradiation apparatus to be particularly compact, wherein the space over the second semi-circular surface portion is available for other uses as well as a matter of principle, such as for a dosing apparatus for applying a liquid onto the substrate to be irradiated.

In another, likewise preferred modification of the apparatus according to the invention, the invention provides the first emitter tube to have a first emitter tube diameter, and provides the first and the second radius of curvature of the first emitter tube to be least 1.0 times, preferably at least 1.5 times, the first emitter tube diameter.

The emitter tube having a curvature with a radius of curvature which is 1.0 times the emitter tube diameter at a given angle of curvature, allows for an emitter tube bend of small spatial dimensions and contributes to a compact design of the apparatus. A radius of curvature that is at least 1.5 times the emitter tube diameter, is simple and inexpensive to manufacture.

It has proven to be expedient to provide a reflector for reflecting the optical radiation within the housing.

The presence of a reflector enables an energy efficient operation of the apparatus. Moreover, the presence of a reflector also leads to more rapid heating of the substrate such that the process time can be shortened as well. The reflector can be of a diffuse or specular reflecting type. It is attached, for example, on the emitter or on the housing or the housing itself acts as a reflector. For example, a coating of gold, a coating of opaque quartz glass or a housing part manufactured from highly polished aluminum is suitable for reflection of optical radiation.

The apparatus according to embodiments of the invention having a first emitter in the form of an infrared emitter is particularly well-suited for the processing of semiconductor wafers. In the processing of a semiconductor wafer, it often crucial to heat the semiconductor wafer particularly homogeneously.

Furthermore, the apparatus according to embodiments of the invention for irradiating a substrate, having a first emitter in the form of a gas discharge emitter with a noble gas filling can be used advantageously to cure coatings on optical storage media or semiconductor wafers. Preferably, argon, krypton or xenon can be used as the filling gas.

It has proven to be advantageous to arrange a two-dimensional window that is transparent for optical radiation between the irradiation surface and the plane of curvature, wherein the window is manufactured from quartz glass, aluminum silicate glass, Vycor or sapphire and transmits more than 75%, preferably more than 85%, of the optical radiation that is generated by the emitter and impinges on the window. A window of this type is used to protect the emitter from contamination. Vycor is the brand name of a glass made by Corning.

It has also proven expedient that the apparatus comprises a cooling element that enables cooling of the substrate by a gas flow. Suitable gases include, for example, noble gases and nitrogen.

Preferably, the housing has a thermal shock resistance of more than 10 K s$^{-1}$, more preferably more than 100 K s$^{-1}$, and a thermal mass (defined as density*specific heat at 20° C.) of less than 2.5 J cm$^{-2}$ K$^{-1}$, particularly preferably of less than 1.8 J cm$^{-2}$ K$^{-1}$.

With regard to the emitter, the afore-mentioned technical object is solved based on an emitter having the features according to embodiments of the invention as mentioned above in that the emitter tube has a curved illumination length section which extends with a mirror symmetrical-oval basic shape in the plane of curvature, wherein the illumination length section, as seen from the emitter tube, comprises, in succession, a first curved section a curvature to the left and a first radius of curvature, a second curved section with a curvature to the right and a second radius of curvature, a third curved section with a curvature to the right and a third radius of curvature, a fourth curved section with a curvature to the right and the second radius of curvature, and a fifth curved section with a curvature to the left and the first radius of curvature, the third radius of curvature is larger than the first and the second radius of curvature by at least a factor of three.

Optical emitters in the scope of the invention are, for example, infrared emitters, UV emitters or emitters for the emission of visible light. The emitter according to embodiments of the invention is particularly well-suited for uniform irradiation of a semicircular irradiation zone. The semicircular irradiation zone comprises an outer zone associated with the circular peripheral region of the irradiation zone, and an inner zone that surrounds the center of the corresponding full circle in the form of a semi-circle.

The emitter according to embodiments of the invention comprises multiple arcuate curved sections, whose extension is defined by a central axis of the emitter tube. A curved section shall be understood to mean a section of the emitter tube, whose extension can be described in approximation by a circle. In this context, one radius of curvature each is specified for each curved section. The curved sections can be right next to each other or can be situated at a distance from each other.

Moreover, each curved section comprises a direction of curvature, which can extend to the right or to the left as seen in a top view onto the plane of curvature.

Since the third radius of curvature is larger than the first and the second radii of curvature by at least a factor of three, a relatively flat and elongated third curved section, as compared to the other curved sections, is obtained and is subsequently available for irradiation, for example, of the outer zone of the irradiation zone. As a result, a comparatively large illumination length section is being associated with the peripheral region of the irradiation zone. Preferably, the length of the third curved section accounts for 25% to 50% of the illumination length section.

Moreover, the further extension of the curved sections, in particular of the curved sections one and five, provides for sufficient irradiation of the inner zone of the irradiation surface.

According to embodiments of the invention, the illumination length section comprises a mirror symmetrical-oval basic shape. The basic shape is either closed or open. Preferably, the basic shape is open. The mirror symmetry of the basic shape also contributes to uniform irradiation of the base surface.

In a preferred embodiment of the emitter according to the invention, the invention provides the first and the second curved section and the fourth and the fifth curved section are situated at a distance by a linear emitter tube section.

The presence of the emitter tube section allows both the distance between the emitter tube ends and the position of the power supplies that are guided through the emitter ends to be adjusted.

In addition, the extension and the length of the linear sections affects the irradiation distribution with respect to the base surface.

In another, likewise preferred modification of the emitter according to the invention, the invention provides the emitter tube to comprise an emitter tube length, and provides the illumination length section to account for at least 75%, preferably at least 90%, of the respective emitter tube length.

Since the illumination length section accounts for at least 75% of the emitter tube length, the emitter tube has a small fraction of non-illuminated regions, whereby a compact emitter is obtained. This applies, in particular, when the illumination length section accounts for at least 90% of the emitter tube length.

It has proven expedient that the emitter tube comprises an emitter pipe diameter, and that the first and the second radius of curvature of the emitter tube is at least 1.0 times, preferably at least 1.5 times, the first emitter tube diameter.

The radius of curvature being at least 1.0 times, preferably at least 1.5 times, the diameter of the emitter tube contributes to a compact design of the emitter and is also simple and inexpensive to manufacture.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
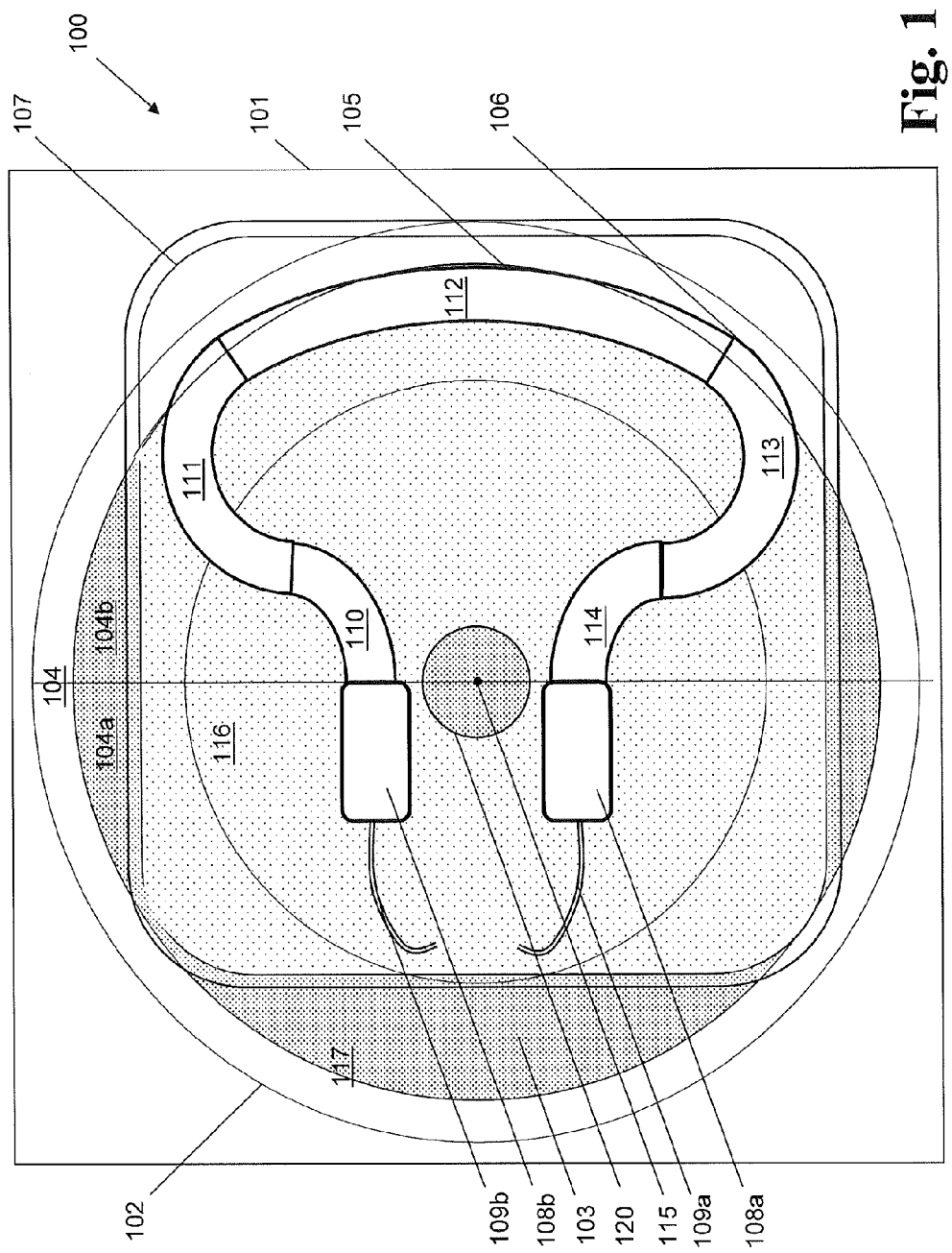
FIG. 1 shows a first embodiment of the apparatus according to the invention for irradiating a substrate having an optical emitter that comprises a mirror-symmetrical-oval illumination length section.

FIG. 1 shows a schematic top view of a first embodiment of the irradiation apparatus according to the invention for the processing of semiconductor wafers, to which, altogether, reference number 100 is assigned. The apparatus 100 comprises a housing 101 and, inside the housing 101, a receptacle 102, which can be rotated about a rotation axis (not shown), for a substrate 103 to be irradiated, a thermal infrared emitter 105 having an emitter tube 106 and a passage 120 for a dosing apparatus (not shown).

The receptacle 102 comprises a circular irradiation surface 104, which is sub-divided into a first semi-circular surface portion 104a and a second semi-circular surface portion 104b. Furthermore, the irradiation surface comprises an inner irradiation zone 116 in the form of a circular surface and a ring-shaped outer irradiation zone 117 of the same surface area.

The thermal infrared emitter 105 inside the housing 101 is arranged in a plane of curvature that extends parallel to the irradiation surface 104. Gas-tight seals 108a, 108b of the emitter tube 106, through which the power supplies 109a, 109b are respectively guided, are provided at both ends of the emitter tube 106. A layer of $SiO_2$ acting as a reflector is applied to the side of the emitter tube 106 that faces away from the substrate. The emitter tube 106 further comprises multiple arcuate curved sections 110, 111, 112, 113, 114.

Viewed from the center 115 of the apparatus 100, the curved section 110 comprises a curvature to the left with a radius of curvature of 25 mm, the curved section 111 comprises a curvature to the right with a radius of curvature of 25 mm, the curved section 112 comprises a curvature to the right with a radius of curvature of 180 mm, the curved section 113 comprises a curvature to the right with a radius of curvature of 25 mm, and the curved section 114 comprises a curvature to the left with a radius of curvature of 25 mm.

The arcuate curved sections 110, 111, 112, 113, 114 form the illumination length section of the infrared emitter 105. The illumination length section extends in the plane of curvature with a mirror symmetrical-oval shape; it is arranged exclusively over the semi-circular surface portion 104b and accounts for 90% of the emitter tube length. In this embodiment, 65% of the length of the emitter tube 106 is associated with the outer ring-shaped irradiation zone 117.

A window 107 made of quartz glass is arranged between the plane of curvature and the irradiation surface 104.

In an alternative embodiment, the invention provides the apparatus 100 to comprise a second infrared emitter (not shown) which is also arranged in the plane of curvature. The second infrared emitter is designed alike the infrared emitter 105; it is arranged in the plane of curvature with an appropriate offset with respect to the infrared emitter 105 such that the illumination length sections of the infrared emitter 105 and of the second infrared emitter are point-symmetrical with respect to each other.

Figure 2:
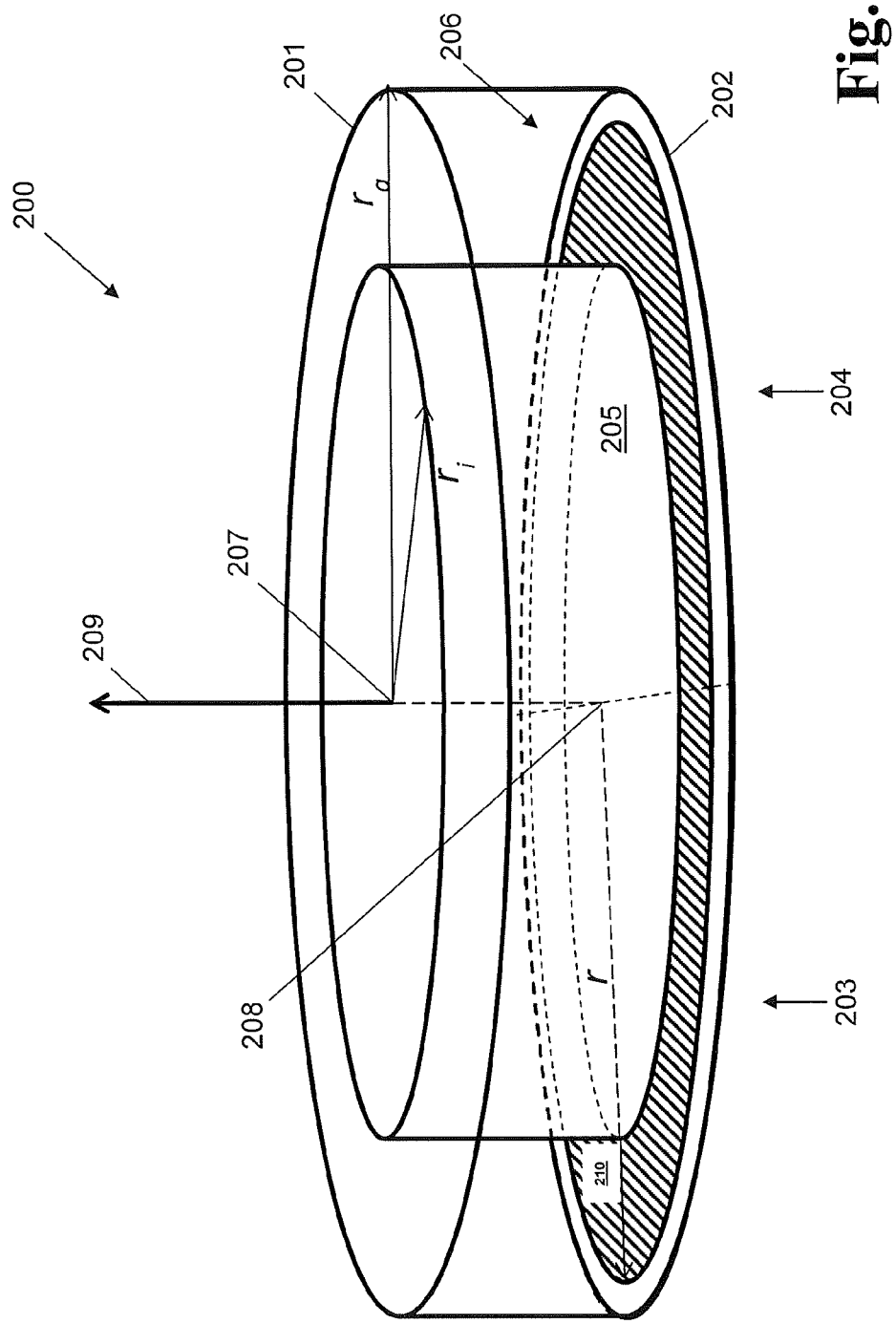
FIG. 2 shows a spatial view of a second embodiment of the apparatus according to the invention having an irradiation space situated between the irradiation surface and the plane of curvature, wherein the irradiation surface comprises a circular inner irradiation zone and a ring-shaped outer irradiation zone.

FIG. 2 shows a schematic view of a second embodiment of the apparatus according to the invention for irradiating a substrate 200. The apparatus 200 comprises a receptacle for the substrate to be irradiated having an irradiation surface 202 and a plane of curvature 201.

The plane of curvature 201 of the apparatus 200 is shown as a circle with the center 207 in FIG. 2. In the plane of curvature 201, the emitter tube of a curved infrared emitter extends in the form of an illumination length section that extends with mirror symmetrical-oval shape in the plane of curvature (not shown).

The irradiation surface 202 is arranged parallel to the plane of curvature 201; it is also shown as a circle. The center 208 of the circular surface of the irradiation surface 202 and the center 207 define a rotation axis 209 about which the infrared emitter and the receptacle for the substrate to be irradiated can be moved with respect to each other. The irradiation surface 202 comprises a first semi-circular surface portion 203 and a second semi-circular surface portion 204. Moreover, the irradiation surface 202 comprises an inner irradiation zone 205 in the form of a circular surface having a radius of $r_i$. The inner irradiation zone 205 is surrounded by an outer ring-shaped irradiation zone 206, whose radius is denoted as $r_a$. The inner radiation zone 205 and the outer ring-shaped irradiation zone have the same surface area. Accordingly, the relation of the radii $r_i$ and $r_a$ is described by the following mathematical relationship: $r_a = r_i * \sqrt{2}$.

For a better overview, the substrate to be irradiated is drawn in FIG. 2 as a cross-hatched circular surface 210 having a radius r.

The irradiation space of the apparatus 200 is situated between the plane of curvature 201 and the irradiation surface 202.

Figure 3:
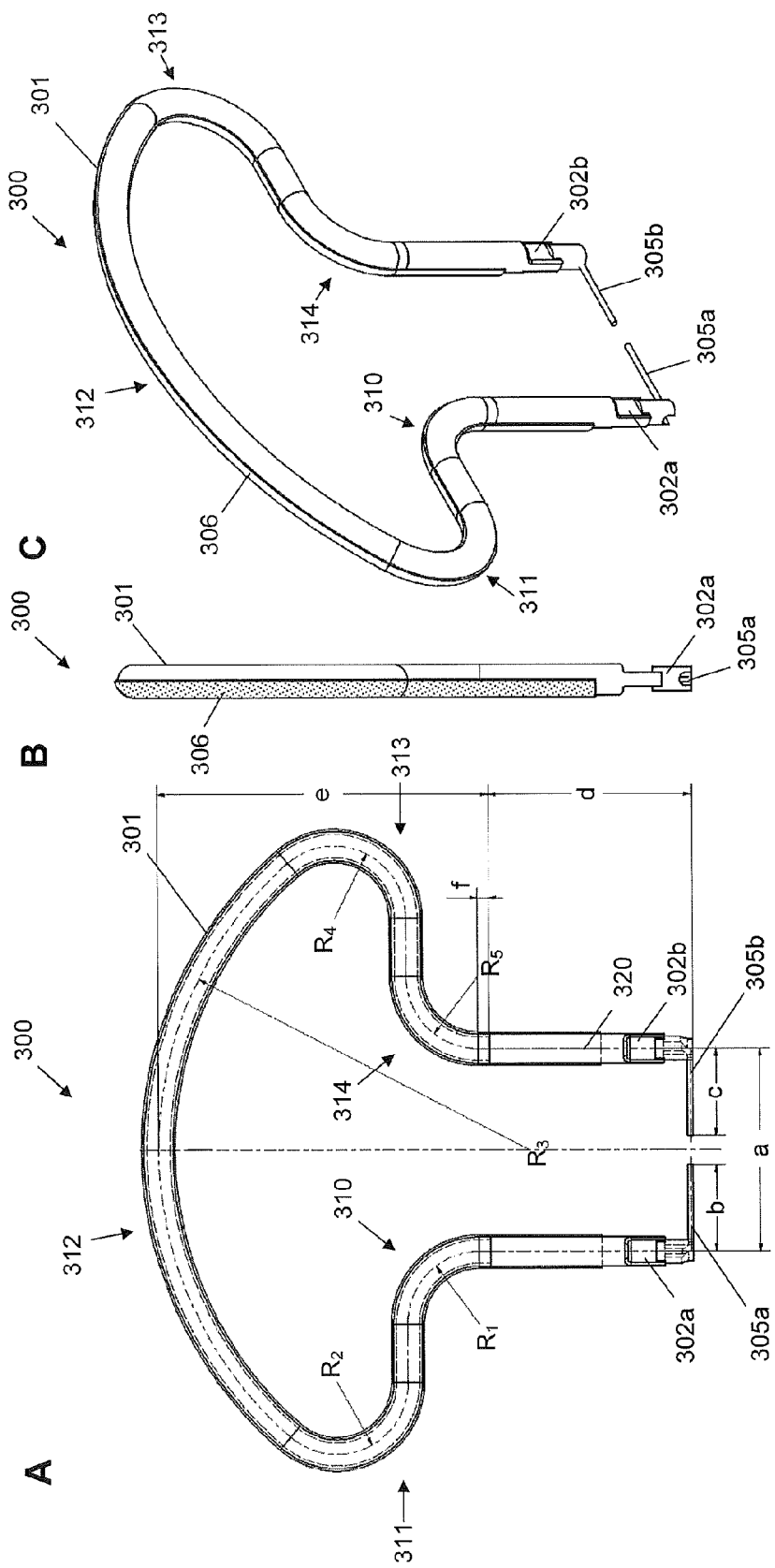
FIG. 3 shows first embodiment of an emitter for generating optical radiation according to the invention for insertion into an apparatus according to the invention for irradiating a substrate.

FIG. 3 shows a first embodiment of the thermal infrared emitter 300 according to the invention in a top view (A), side view (B), and in a spatial view (C). The thermal infrared emitter 300 is well-suited for use in the apparatus 100, 200 according to the invention according to FIG. 1 and/or FIG. 2.

The infrared emitter 300 comprises an emitter tube 301 that is curved in a plane of curvature and has multiple curved sections 310, 311, 312, 313, 314. The profile of curvature of the emitter tube 301 is given by the dashed line 320. The radii of curvature are $R_1=25$ mm, $R_2=25$ mm, $R_3=130$ mm, $R_4=25$ mm, and $R_5=25$ mm. A tungsten filament (not shown) is arranged inside the emitter tube 301 as a thermal emitter. For electrical contacting of the tungsten filament, gas-tight seals 302a, 302b, through which the respective the power supplies are guided, are provided at both ends of the emitter tube 301. The gas-tight seals 302a, 302b are situated at a distance a of 70 mm. The length b, c of the current supply leads 305a, 305b is 200 mm. The emitter dimensions d, e, and f are 71 mm, 116 mm, and 4 mm, respectively. The emitter tube 301 comprises an emitter tube outer diameter of 10 mm, and is filled with argon. The filling pressure is 800 mbar at room temperature.

The emitter 300 has a rated voltage of 360 V and a rated power of 2,790 W. The length of the tungsten filament is 465 mm. Accordingly, the specific power of the emitter 300 based on the length of the filament at the rated voltage is 60 W/cm. The filament temperature at the rated voltage is 1,600° C.

An emitter layer made of opaque, diffuse scattering quartz glass is applied to one side of the emitter tube 301 (QRC® made by Heraeus Noblelight).

Figure 4:
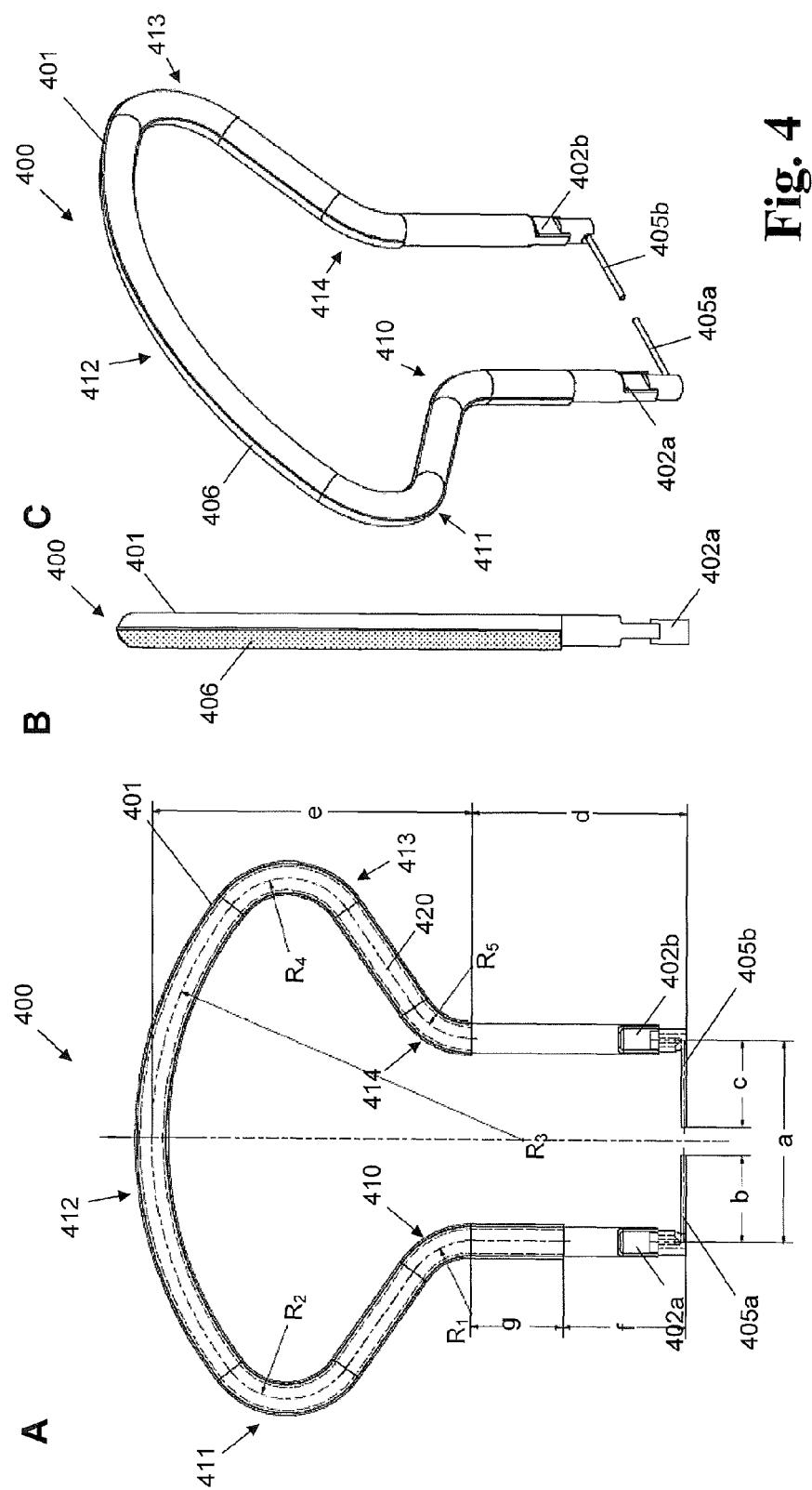
FIG. 4 shows a second embodiment of an emitter for generating optical radiation according to the invention for insertion into an apparatus according to the invention for irradiating a substrate.

Moreover, FIG. 4 shows a second embodiment of the emitter according to the invention in the form of the thermal infrared emitter 400 in a top view (A), side view (B), and in a spatial view (C). The thermal infrared emitter 400 is well-suited for use in the apparatus 100, 200 according to the invention according to FIG. 1 and/or FIG. 2.

The infrared emitter 400 comprises an emitter tube 401 that is curved in a plane of curvature and has multiple curved sections 410, 411, 412, 413, 414. The profile of curvature of the emitter tube 401 is given by the dashed line 420. The radii of curvature are $R_1=25$ mm; $R_2=25$ mm; $R_3=130$ mm; $R_4=25$ mm and $R_5=25$ mm. A tungsten filament (not shown)

is arranged inside the emitter tube 401 as a thermal emitter. For electrical contacting of the tungsten filament, gas-tight seals 402a, 402b, through which the respective the power supplies are guided, are provided at both ends of the emitter tube 401. The gas-tight seals 402a, 402b are situated at a distance a of 70 mm. The length b, c of the current supply leads 405a, 405b is 200 mm. The emitter dimensions d, e, h, and g are 75 mm, 112 mm, 43 mm, and 32 mm, respectively. The emitter tube 401 comprises an emitter tube outer diameter of 10 mm, and is filled with argon. The filling pressure is 800 mbar at room temperature.

The emitter 400 has a rated voltage of 360 V and a rated power of 4,300 W. The length of the tungsten filament is 430 mm. Accordingly, the specific power of the emitter 400 based on the length of the filament at the rated voltage is 100 W/cm. The filament temperature at the rated voltage is 2,600° C.

An emitter layer made of opaque, diffuse scattering quartz glass is applied to one side of the emitter tube 401 (QRC® made by Heraeus Noblelight).

Example 1a

The use of the apparatus according to the invention for curing protective lacquer on data media blanks (CD, DVD, Blue Ray, etc.) by spin coating is described in the following.

The medium to be cured (a lacquer, an epoxy resin or the like) is added as a fluid to the center of the rapidly rotating data medium such that it is homogeneously distributed on the surface of the data medium due to the rotation of the data medium. Once the surface is wetted completely and the layer is almost homogeneous, the fluid is subjected to intense radiation, which enables the cross-linking of monomers of the fluid.

An emitter according to the invention in the form of a discharge lamp, which, in normal operation, emits a large fraction of its radiation intensity in the range of the effective wavelength for cross-linking, is used for curing of the protective lacquer.

The optical emitter is arranged in a plane parallel to the surface of the data medium at a distance of 20 mm. The distance is defined, on the one hand, through the center of the discharge in the emitter tube and, on the other hand, by the surface of the data medium. The electrodes of the optical emitter are arranged appropriately such that the contact points of the arc of the emitter in new condition are situated on a plane which also includes the rotational axis.

The emitter tube of the optical emitter is made of a quartz glass tube of 1*6 mm, where the first number ("1") is the wall thickness in mm, and the second number ("6") is the external diameter in mm. The bend radii of the emitter tube are at least 10 mm.

In order for the cured coating to have a homogeneous layer thickness, the irradiation apparatus comprises an opening for dosing the fluid in the region of the rotational axis of the data medium. The apparatus for accommodating and rotating the data medium is located below, and the irradiation apparatus is situated above, the plane defined by the data medium.

The housing of the irradiation apparatus consists of a body made of aluminum having, on the emitter side, high quality surfaces reflecting the optical radiation. The housing fully encloses the optical emitter. The electrical leads are also arranged in the housing. Moreover, not only the leads for the electrical connections and the passage for the dosing apparatus, but also supply and discharge lines for a cooling gas are introduced into the aluminum body, such that the housing can be actively cooled using up to 10 l/min of nitrogen. A window made of quartz glass 2.0 mm in thickness is placed between the optical emitter and the data medium. The quartz glass window is attached to the aluminum body in the absence of an additional seal; the gap widths are consistently less than 0.1 mm. In this context, the quartz glass has a thermal shock resistance of 1,000 K s$^{-1}$, aluminum of better than 10 K s$^{-1}$, the thermal mass (defined as density*specific heat at 20° C.) of aluminum is 2.42 J cm$^{-2}$ K$^{-1}$, of quartz better than 1.8 J cm$^{-2}$ K$^{-1}$.

Example 1b

The use of the apparatus according to the invention for curing protective lacquer on data media blanks (CD, DVD, Blue Ray, etc.) by spin coating is described as a further exemplary embodiment in the following.

Example 1b corresponds to Example 1a except for the following differences:

The apparatus according to Example 1b differs from the apparatus of Example 1a in that the housing does not enclose the optical emitter completely. The emitter ends of the optical emitter are guided out of the irradiation space. They are sealed such as to be water-tight in the region, in which they are guided out of the irradiation space. The electrical leads are arranged outside the housing. Furthermore, inlets and outlets for a cooling fluid are introduced in the aluminum body such that the housing can be actively cooled with up to 6 l/min deionized water. In order to avoid leakage of cooling fluid, the quartz glass window is mounted on the aluminum body of the housing with an additional Viton seal.

Example 2

Example 2 relates to the application of the apparatus according to the invention according to FIG. 1 in a process for curing protective lacquer on data medium blanks (CD, DVD, Blue Ray, etc.) by spin coating.

Example 2 corresponds to Example 1a except for the following differences:

The housing of the irradiation apparatus is a body made of quartz glass, which is coated on the emitter side with a layer of opaque, diffuse reflective quartz glass (QRC® made by Heraeus Noblelight).

In addition to leads for the electrical connections and the passage for the dosing apparatus, inlets and outlets for a cooling gas are introduced into the housing such that the housing can be cooled actively with up to 2 l/min of nitrogen.

Example 3a

In the following, the use of the apparatus according to the invention for cleaning of silicon wafers with a diameter of 12 inches, or 300 mm, is described.

For this purpose, a cleaning solution that comprises a solvent (e.g., water, methanol, isopropanol, acetone), which can also contain active substances (e.g., sulfuric acid, phosphoric acid, ammonia, aqua regia, hydrofluoric acid), is applied to the wafer from above. To render the process particularly intense or quick, the cleaning solution is placed on the wafer while it has a temperature close to the evaporation point of the liquid. In order to maintain a uniform temperature on the wafer and to counteract cooling by removing heat of evaporation, the wafer is irradiated with infrared radiation.

Infrared radiation in the range of <1,100 nm is preferably used if the wafer is to be heated, whereas infrared radiation >1,500 nm is preferably used if the cleaning solution is to be heated.

In the present case, the following arrangement is selected:

An apparatus that places the cleaning solution on the wafer is attached above the fast-rotating wafer (>100 min$^{-1}$); otherwise, the wafer is exposed to a gas flow of low turbulence from above.

Situated below the wafer, there is an apparatus for accommodation of the wafer by means of pins; concurrently, this apparatus makes the wafer rotate. Moreover, the irradiation apparatus is situated between the rotary apparatus and the wafer, but is at rest.

The housing of the irradiation apparatus consists of an opaque glass ceramics (e.g., MACOR™ made by Corning) and is made in one piece. Supply leads for the electrical connections of the emitter and channels for the supply of cooling gas are provided. A pane of quartz glass (e.g., GE 200 or equivalent grade) with a thickness of 1.5 mm is provided as an optical window. The window is placed with a gap width of 0.15 mm, wherein the gap is defined by means of some suitable contact points projecting from the housing such that a cooling gas rate of 1.3 l/min is attained. Nitrogen is provided as the cooling gas.

The thermal mass of MACOR and of quartz glass is 2.0 J cm$^{-2}$K$^{-1}$ and less than 1.8 J cm$^{-2}$ K$^{-1}$, respectively.

An optical emitter according to FIG. 4 is inserted into the housing.

Example 3b

Example 3b describes an alternative embodiment of an apparatus according to the invention and the use thereof for cleaning silicon wafers having a diameter of 12 inches, or 300 mm.

Example 3b corresponds to Example 3a except for the following differences:

The housing is made of quartz glass (e.g., 7940 made by Corning) in one piece. Supply leads for the electrical connections of the emitter and channels for the supply and discharge of cooling gas are provided. A pane made of quartz glass having a thickness of 1.5 mm, which is mounted without a defined gap, is provided as the optical window.

Nitrogen is provided as the cooling gas. A cooling gas rate of 1.0 l/min is attained.

The optical emitter used presently is the emitter from FIG. 3.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the invention as defined by the appended claims.

We claim:

1. An apparatus for irradiating a substrate, the apparatus comprising a housing and, within the housing, a receptacle for the substrate to be irradiated, the substrate having a circular irradiation surface comprising a first semi-circular surface portion and a second semi-circular surface portion, a first emitter to generate optical radiation, the first emitter having a first emitter tube arranged in a plane of curvature extending parallel to the circular irradiation surface and having an emitter tube end through which a power supply is guided, wherein the receptacle and the first emitter are rotatable with respect to each other about a rotational axis, wherein the first emitter tube has a curved illumination length section extending with a mirror symmetrical-oval basic shape in the plane of curvature, and wherein the curved illumination length section is associated with one of the semicircular surface portions.

2. The apparatus according to claim 1, wherein the curved illumination length section of the first emitter comprises multiple arcuate curved sections each having a radius of curvature, wherein the curved illumination length section, as seen from the emitter tube end, comprises, in succession, a first curved section having a curvature to the left and a first radius of curvature, a second curved section having a curvature to the right and a second radius of curvature, a third curved section having a curvature to the right and a third radius of curvature, a fourth curved section having a curvature to the right and the second radius of curvature, and a fifth curved section having a curvature to the left and the first radius of curvature, and wherein the third radius of curvature is larger by at least a factor of three than the first and the second radii of curvature.

3. The apparatus according to claim 2, wherein the first and the second curved sections as well as the fourth and the fifth curved sections are spaced from each other by a linear emitter tube section.

4. The apparatus according to claim 1, wherein the first emitter tube has an emitter tube length, and wherein the curved illumination length section of the first emitter accounts for at least 75% of the emitter tube length.

5. The apparatus according to claim 4, wherein the curved illumination length section of the first emitter accounts for at least 90% of the emitter tube length.

6. The apparatus according to claim 1, wherein the circular irradiation surface comprises an inner irradiation zone having a form of a circular surface and a ring-shaped outer irradiation zone surrounding the inner irradiation zone, wherein the circular inner irradiation zone and the ring-shaped outer irradiation zone have the same surface area, and wherein 40% to 70% of the length of the curved illumination length section of the first emitter are associated with the outer ring-shaped irradiation zone.

7. The apparatus according to claim 1, wherein the curved illumination length section of the first emitter is arranged exclusively over the first semicircular surface portion.

8. The apparatus according to claim 2, wherein the first emitter tube has a first emitter tube diameter, and wherein the first and the second radius of curvature of the first emitter tube are at least 1.0 times the first emitter tube diameter.

9. The apparatus according to claim 8, wherein the first and the second radius of curvature of the first emitter tube are at least 1.5 times the first emitter tube diameter.

10. The apparatus according to claim 1, further comprising a reflector within the housing to reflect the optical radiation.

11. A method for processing semiconductor wafers, the method comprising irradiating a semiconductor wafer substrate using the apparatus according to claim 1, wherein the first emitter is an infrared emitter.

12. A method for curing coatings on optical storage media or semiconductor wafers, the method comprising irradiating a storage media substrate or a semiconductor wafer substrate using the apparatus according to claim 1, wherein the first emitter is a gas discharge emitter having a noble gas filling.

13. An emitter for generating optical radiation, the emitter comprising an emitter tube curved in a plane of curvature and having an emitter tube end through which a power supply is guided, the emitter tube comprising multiple arcuate curved sections each having a radius of curvature, the emitter tube having a curved illumination length section extending with a mirror symmetrical-oval basic shape in the plane of curvature, wherein the curved illumination length section, as seen from the emitter tube end, comprises, in succession, a first curved section having a curvature to the left and a first radius of curvature, a second curved section having a curvature to the right and a second radius of curvature, a third curved section having a curvature to the right and a third radius of curvature, a fourth curved section having a curvature to the right and the second radius of curvature, and a fifth curved section having a curvature to the left and the first radius of curvature, and wherein the third radius of curvature is larger by at least a factor of three than the first and the second radii of curvature, the emitter being rotatable about a rotational axis with respect to a receptacle toward which the generated optical radiation is emitted.

14. The emitter according to claim 13, wherein the first and the second curved sections, as well as the fourth and the fifth curved sections, are spaced from each other by a linear emitter tube section.

15. The emitter according to claim 13, wherein the first emitter tube has an emitter tube length, and wherein the curved illumination length section accounts for at least 75% of the emitter tube length.

16. The emitter according to claim 15, wherein the curved illumination length section accounts for at least 90% of the emitter tube length.

17. The emitter according to claim 13, wherein the emitter tube has an emitter tube diameter, and wherein the first and the second radii of curvature of the emitter tube are at least 1.0 times the diameter of the first emitter tube.

18. The emitter according to claim 17, wherein the first and the second radii of curvature of the emitter tube are at least 1.5 times the diameter of the first emitter tube.

* * * * *